United States Patent [19]
Armstrong

[11] Patent Number: 4,676,008
[45] Date of Patent: Jun. 30, 1987

[54] CAGE-TYPE WAFER CARRIER AND METHOD

[75] Inventor: Richard J. Armstrong, Phoenix, Ariz.

[73] Assignee: Microglass, Inc., E. Syracuse, N.Y.

[21] Appl. No.: 864,195

[22] Filed: May 16, 1986

[51] Int. Cl.⁴ .............................................. F26B 25/18
[52] U.S. Cl. ..................................... 34/237; 269/296; 206/454; 211/41; 432/261
[58] Field of Search ................ 269/296; 414/416, 417, 414/411, 422; 206/454, 334; 211/41; 34/236, 237; 432/261, 262, 265

[56] References Cited

U.S. PATENT DOCUMENTS

| 3,951,587 | 4/1976 | Alliegro et al. | 206/454 |
| 4,171,740 | 10/1979 | Clement et al. | 206/454 |
| 4,568,234 | 2/1986 | Lee et al. | 414/416 |
| 4,588,086 | 5/1986 | Coe | 206/334 |

Primary Examiner—Larry I. Schwartz
Attorney, Agent, or Firm—Cahill, Sutton & Thomas

[57] ABSTRACT

A cage-type wafer carrier is provided which can be loaded and unloaded with semiconductor wafers by means of an automatic wafer transfer machine. No large slots are required in the bottom section of the cage-type carrier for allowing elevator lifts to pass therethrough to engage the wafers.

17 Claims, 12 Drawing Figures

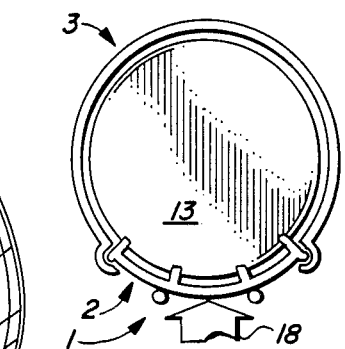
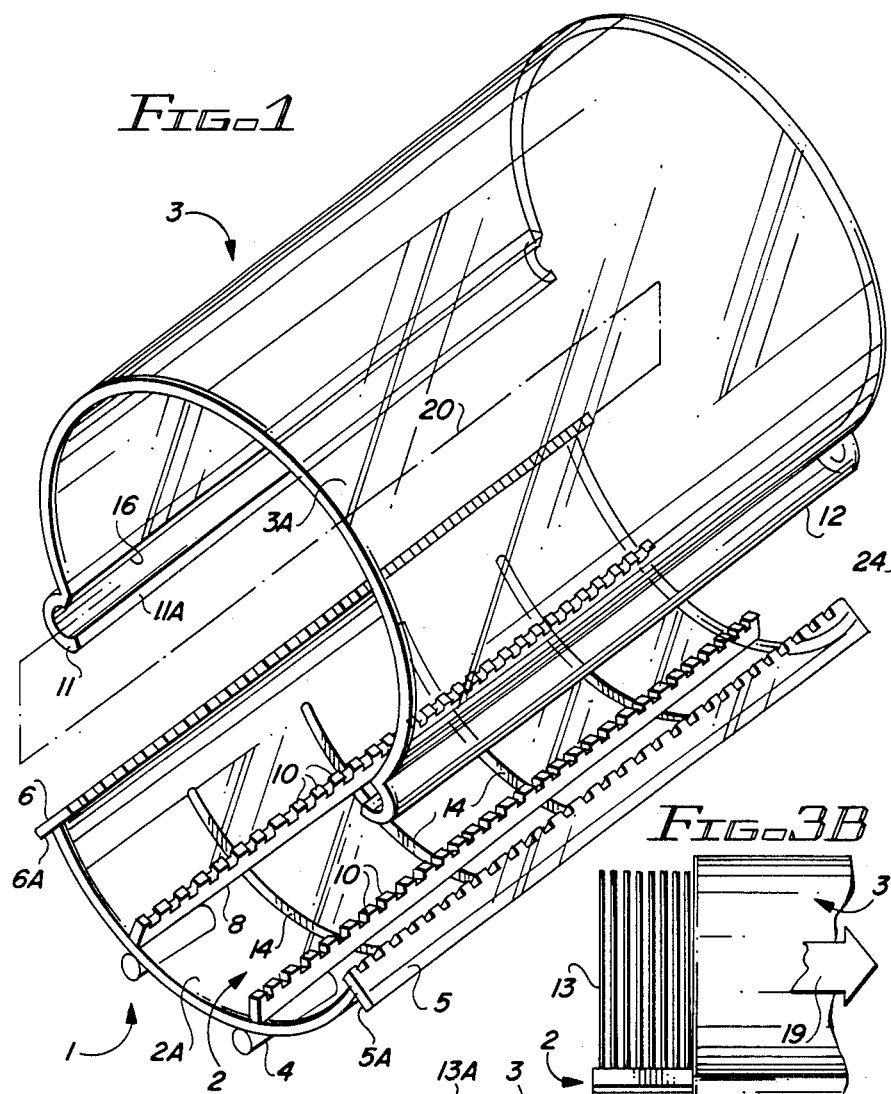
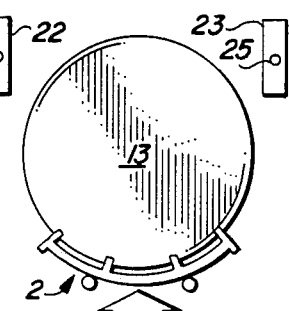
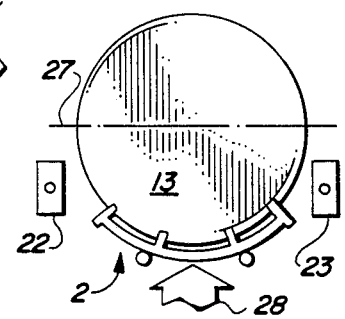
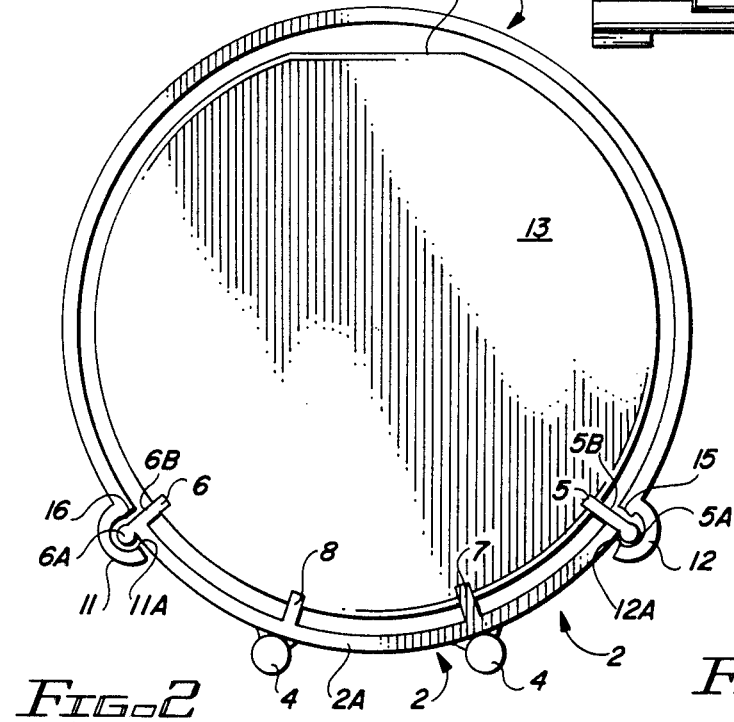
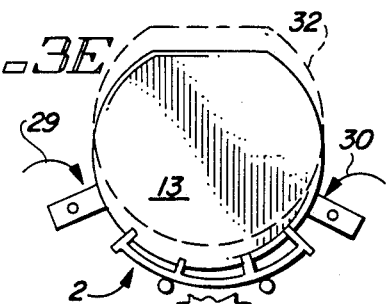
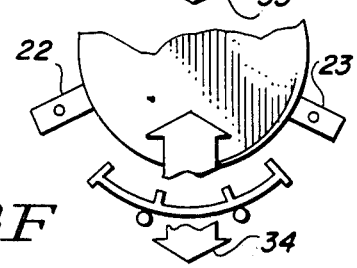

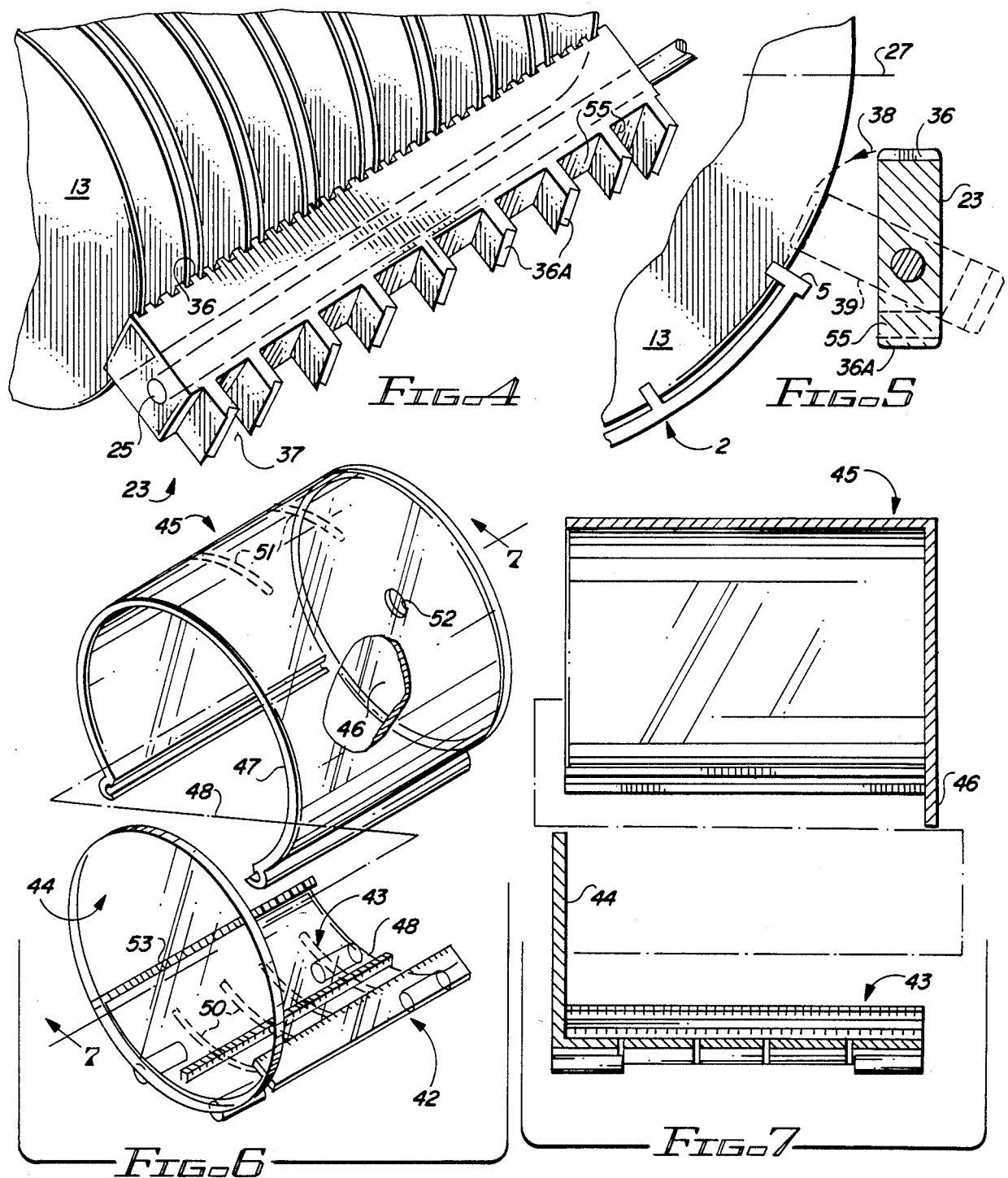

CAGE-TYPE WAFER CARRIER AND METHOD

BACKGROUND OF THE INVENTION

The invention relates to cage-type carriers of the type including a lower section supporting a plurality of closely spaced, parallel semiconductor wafers and having a removable cover that mates with the lower section, in effect, to provide a tube surrounding the wafers in order to achieve uniform flow of reactant gases between the wafers.

One type of quartz wafer boat or carrier that has found widespread commercial acceptance for various processes used in the semiconductor industries is referred to herein as a "cage-type" carrier. The state-of-the-art for cage-type carrier is indicated by one that is manufactured by Process Technology Ltd. of Oromocto, New Brunswick, in Canada. That cage-type carrier includes a 180° semicylindrical thin quartz sheet forming a boat section having three or four grooved rods that support about 25 large semiconductor wafers in precisely spaced, parallel fashion. A similar 180° semicylindrical thin quartz sheet forms a cover section that rests on the upper edges of the boat section, so that the wafers loaded in the boat section are, in effect, surrounded by a cylindrical quartz tube. Radial slots are formed in the boat section to allow outward flow of reactant gases into the cage-type carrier and thereby provide uniform gas flow patterns between all of the wafers therein.

A major problem of all of the prior cage-type carriers is that they are not easily adapted for effective use with automatic wafer transfer machines. To understand the importance of this disadvantage, it is necessary to understand that many, perhaps most major semiconductor manufacturers have moved as far in the direction of providing automated wafer handling as is presently practical, and also have taken as many steps as practical to minimize frictional contact between wafers, wafer boats, and different components of all wafer handling systems in order to minimize generation of "quartz dust" and "silicon dust". As part of this effort, semiconductor manufacturers also have attempted to completely eliminate the traditional use of metal tweezers to grip edges of wafers to transfer them from one carrier to another. The above-mentioned quartz dust and silicon dust are known to adhere, by static electricity or otherwise, to surfaces of semiconductor wafers during various manufacturing processes and thereby produce wafer defects that substantially reduce the manufacturing yield and hence substantially increase the per unit cost of the manufactured electronic chips.

A problem that exists with all prior cage-type carriers is that in order to use them in conjunction with state of-the-art automatic wafer transfer machines, it has been necessary to provide large slots in the bottom of the semicylindrical section boat of the cage-type carrier to admit the elevator members of some wafer transfer machines, such as the one described in commonly assigned U.S. Pat. No. 4,573,851. It is undesirable to provide such large slots because they interrupt the uniform reactant gas flow patterns between the wafers inside the closed cage-type wafer carrier during semiconductor processing operations. Nonuniformity of the reactant gas flow patterns between wafers causes reduction in the manufacturing yield of the chips.

Accordingly, it can be seen that there is an unmet need for an improved cage-type carrier that can be conveniently loaded and unloaded with semiconductor wafers, especially in "back-to-back" processes in which two wafers are loaded into each slot, with their back surfaces adjacent or abutting to minimize exposure of the back surfaces with reactant gases without disrupting the uniform gas flow between loaded wafers that otherwise is achievable with cage-type wafer carriers. Positioning the wafers in abutting back-to-back relationship also has the advantage of increasing the distance between the "active" or "processing" faces of adjacent wafers, because this increases gas reaction rates, such as deposition rates, on the processing surfaces of the wafers. There is a need for a cage-type carrier that can be loaded with back-to-back pairs of abutting wafers without use of tweezers.

SUMMARY OF THE INVENTION

Accordingly, it is an object of the invention to provide a cage-type carrier that is readily usable with commercially available automatic wafer transfer machines, without the need to provide slots in the carrier that disrupt uniform gas flows between semiconductor wafers therein.

It is another object of the invention to provide a method of automatically transferring wafers to or from such a cage-type carrier.

Briefly described, and in accordance with one embodiment thereof, the invention provides a cage-type carrier having a semicylindrical lower section or boat section that subtends an arc of substantially less than 180°, typically about 130°, in order to allow wafer supporting grooves of a wafer edge retainer of an automatic wafer transfer machine to engage wafers loaded in the boat section below their longitudinal center lines, and thereby support those wafers when the boat section is lowered away from the wafers, without the requirement that the wafer edge retainer pass through any portion of the boat section. In the described embodiment of the invention, a semicylindrical upper section or cover section subtends an arc of substantially greater than 180°, typically about 230°, so that when the cover section is positioned on and mates with the boat section, an essentially cylindrical quartz tube surrounds the loaded wafers. Relatively small openings, such as radial slots or small holes, are provided in the semicylindrical lower section to effectuate uniform flow of reactant gas between the loaded wafers. In order to prevent wafers loaded in the boat section from being dislodged from the grooves supporting the wafers in the boat section, flanges are provided along the lower outer edges of the cover section in one embodiment of the invention to engage and lift the boat section if the cover section is inadvertently lifted vertically. Such flanges extend a predetermined distance below the upper edge of the boat section, so that if the semicylindrical upper section is lifted, the flanges engage the outer surface of the lower section, lifting it and the wafers therein, thereby preventing the inner surface of the cover section from dislodging the wafers. Proper removal of the cover section from the lower boat section can be accomplished only by moving the cover section in parallel relationship to the boat section until it is cleared by the cover section. In one described embodiment of the invention, a circular end plate having a radius equal to the radius of curvature of the boat and cover sections is provided on one end of the boat section. A similar circular end plate is provided on the opposite end of the cover section, so that a closed chamber is provided when the cover section is axially aligned with the boat section and moved horizontally to cover the boat section.

DESCRIPTION OF THE DRAWINGS

FIG. 1 is a perspective view of the cage-type wafer carrier of the present invention.

FIG. 2 is an end view of the cage-type carrier of FIG. 1.

FIGS. 3A–3F are diagrams useful in explaining the operation of unloading wafers from the cage-type carrier of FIG. 1.

FIG. 4 is a partial perspective view illustrating the manner in which a slotted retainer of an automated wafer transfer machine engages wafers supported by the lower portion of the cage-type carrier of FIG. 1.

FIG. 5 is a partial section view showing operation of the structure shown in FIG. 4.

FIG. 6 is a perspective view of an alternate embodiment of the invention including end plates integral with opposite end portions of the upper and lower sections of the cage-type wafer carrier of the present invention.

FIG. 7 is a section view taken along section line 7—7 of FIG. 6.

DESCRIPTION OF THE INVENTION

Referring now to the drawings, particularly FIGS. 1 and 2, the cage-type carrier 1 of the present invention includes a boat section 2 and cover section 3 which rests on and mates with the boat section after wafers 13 are loaded therein. Boat section 2 includes a thin semicylindrical sheet or shell 2A. The arc subtended by semicylindrical shell 2A is about 130°. Four optional feet 4 are welded to the bottom outer surface of lower section 2. Feet 4 can be provided to enhance use of the cage-type carrier 1 with assignee's PHOENIX model automatic wafer transfer machine or a slightly modified version of assignee's CHALLENGER II model automatic wafer transfer machine. Three or four rails such as 5, 6, 7, and 8 are attached to and extend radially upward from the inner surface of semicylindrical shell 2A, each including a plurality of spaced sets of aligned, coplanar wafer supporting grooves 10. Cage-type carrier 1 can be composed entirely of quartz, silicon carbide, polycrystalline silicon, or other suitable material.

A plurality of radial, parallel slots 14 or other suitable openings may extend through the bottom of shell 2A to allow reactant gases to pass uniformly through a load of wafers 13. The size and location of openings such as slots 14 can be determined empirically so as to provide the most uniform possible flow of reactant gas through the supported wafers 13. In the configuration shown in FIG. 1, reactant gas may flow upward through radial slots 14, through the wafers 13, and out of the open ends of the cylindrical tube formed by boat section 2 and cover section 3.

Outer rails 5 and 6 are attached to the longitudinal edges of quartz shell 2A, and extend outward as well as inward, providing a lip 5A and a lip 6A engaging flanges 11 and 12 of cover section 3, preventing it from being inadvertently lifted upward, and thereby preventing wafers 13 from being dislodged by it. Alternately, lips 5A and 6A can be formed of thin cylindrical rods welded to the edges of the rails 5 and 6 or to the edges of the boat section 2, and extend upward slightly as shown to help center or locate cover section 3 on boat section 2.

Cover section 3 is formed of a semicylindrical quartz sheet or shell 3A which subtends an angle of about 230°. Semicylindrical shell 3A has longitudinal lower edges 15 and 16, which rest on the upwardly oriented outer surfaces 5B and 6B of rails 5 and 6, respectively.

In accordance with the present invention, a pair of semicylindrical guide flanges 11 and 12 are attached to the longitudinal edge portions of cover section 3. Longitudinal guide 11 has an inner lip 11A. Longitudinal guide 12 has an inner lip 12A. When cover 3 is in place on lower section 2, the outer portions of rails 5 and 6 extend to within several mils of the inner surface of longitudinal guides 11 and 12, thereby keeping cover section 3 precisely centered on boat section 2. If someone lifts cover section 3 vertically off of boat section 2, as is the common practice with the prior cage-type carriers, it can be seen that the lower inner edge portions of cover section 3 would engage the edges of the wafers 13A, dislodging them from grooves 10 on rails 5–8, obviously causing serious difficulties.

Provision of lips 11A and 12A on cover section 3 and lips 5A and 6A on rails 5 and 6, respectively, prevents this from happening. If someone inadvertently lifts cover section 3 upward, lips 11A and 12A engage lips 6A and 5A, respectively, lifting the entire lower section and the wafers 13 therein, thereby preventing wafers 13 from being dislodged from grooves 10. The clearance between the outer edges of wafers 13 and the inner surfaces of cover 3 and lower section 2 of closed cage-type carrier 1 is about 2 to 5 millimeters.

It is to be noted that there are no large, elongated, longitudinal slots in lower section 2 of cage-type carrier 1 for receiving elevator members of an automatic wafer transfer machine. Therefore, the non-uniformities in the reactant gas flow patterns between wafers 13 that would be caused by such elevator-receiving slots are avoided by the cage type carrier of the present invention.

Next, a basic operation of removing cover 3 from lower section 2 and unloading a load of wafers 13 from cage-type carrier 1 into the "head" section of one of the assignee's automatic wafer transfer machines of the type marketed under the trademark "PHOENIX" is described with reference to FIGS. 3A–3F. The assignee's PHOENIX model automatic wafer transfer machine lifts both the boat section 2 and the wafers therein, as shown in FIGS. 3A–3F, while the assignee's CHALLENGER II model has elevator members that are designed to pass through slots in a wafer boat and lift the wafers out of the boat and raise them into the "head" section of the automatic wafer transfer machine. The CHALLENGER II model can be modified to lift the boat section 2 of FIG. 1 by putting suitable caps on the elevator members.

FIG. 3A shows cage-type carrier 1 loaded with wafers 13 and being lifted by an elevator (not shown) in the direction of arrow 18. The elevator can be the elevator of the assignee's above-mentioned automatic wafer transfer machines, to which foot members 4 can be adapted to engage. Arrow 18 represents a support force holding cage carrier 1 in a stationary position.

FIG. 3B shows horizontal removal of cover section 3 from boat section 2, in the direction of arrow 19, leaving wafers 13 exposed. Preferably, a robotic device, not yet developed, raises cover section 3 a few millimeters with respect to boat section 2, and laterally removes cover section 3 so that there is no frictional contact between cover section 3 and boat section 2.

FIG. 3C indicates that an elevator or the like raises boat section 2 and wafers 13 supported thereby in the direction of arrow 21 into the "head" region of a suitable automatic wafer transfer machine. Boat section 2 and wafers 13 then are raised upward between rotatable retainers 22 and 23, which pivot about stationary axes 24 and 25, respectively, until the horizontal center line 27 of wafers 13 is approximately a quarter of an inch above the upper portions of upper edge retainers 22 and 23 of the automatic wafer transfer machine, as shown in FIG. 3D. Then, wafer edge retainer 22 is rotated in the direction of arrow 29, and wafer edge retainer 23 is rotated in the direction of arrow 30, so that suitable wafer supporting grooves 36, such as those shown in FIG. 4 in the outer end portions of retainers 22 and 23 are oriented to receive the edges of the various wafers 13.

Then, as indicated in FIG. 3E, the elevator lowers boat section 2 in the direction of arrow 33, so that wafers 13 are lowered slightly from their peak position indicated by dotted lines 32 and come to rest in the various grooves 36 of wafer edge retainers 22 and 23. As indicated in FIG. 3F, the elevator continues to lower boat 2 in the direction of arrow 34, leaving wafers 13 supported by wafer edge retainers 22 and 23.

The basic procedure for loading wafers 13 into cage-type carrier 1 is essentially the reverse of the above-described procedure.

One important application for the cage-type carriers is a so-called LTO (low temperature oxide) process wherein it is highly desirable to load pairs of abutting back-to-back wafers in corresponding single slots of the cage-type carrier, so that only the "active" or "processing" surface of each wafer is exposed to the reactant gas flowing through the wafers in the cage-type carrier. The abutting "back" surfaces of the wafers of a pair supported in single slots then avoid being exposed to reactant gas by virtue of the fact that the back surfaces are abutting, preventing the reactant gases from flowing between the abutting back surfaces.

In the past, the only practical way of loading a pair of wafers in abutting back-to-back relationship into corresponding single slots of a cage-type carrier was to use tweezers. However, using the present cage-type carrier in conjunction with the assignee's above-mentioned wafer transfer machine, with suitable grooves provided in the wafer edge retainers thereof, this can be accomplished automatically without use of tweezers, as follows. First, an ordinary plastic carrier loaded with wafers all facing the same direction can be positioned on the stage of the wafer transfer machine. The wafers in the plastic carrier then are automatically lifted into the "head" region of the wafer transfer machine by the elevators thereof. Alternate wafers, for example, odd numbered wafers, from the plastic carrier are retained in the head region by appropriate grooves in the wafer edge retainers such as 22 and 23. (For a basic understanding of how this type of wafer transfer machine operates, see the assignee's U.S. Pat. No. 4,573,851, issued Mar. 4, 1986 (Butler), incorporated herein by reference.)

The elevator, with the remaining or even numbered wafers therein, is lowered onto the stage. The plastic carrier then is manually rotated 180° and is placed back onto the stage. This results in the back surface of each wafer even numbered now facing the opposite direction of the back surface of each odd numbered wafer retained in the head region. The rotation of the plastic carrier and wafers therein also results in the wafers still in the plastic carrier being aligned with pass-through slots in the wafer edge retainers presently supporting the odd numbered wafers in the head region. The even numbered wafers in the plastic carrier then are automatically lifted into the head region of the wafer transfer machine, so that the even numbered wafers in the plastic carrier move through the pass-through slots 55 in the wafer edge retainers 22 and 23. The head mechanism is shifted so that each even numbered wafer is positioned in either abutting or very closely spaced back-to-back relationship with one of the odd numbered wafers originally retained in the head region. In one embodiment of the invention, the back-to-back wafers of each pair are positioned in adjacent, closely spaced slots, as shown in FIG. 4. In another embodiment of the invention (not shown), each of the odd numbered wafers is retained in corresponding grooves in the wafer edge retainers. The remaining even-numbered wafers, after being rotated 180° as explained above, are lifted by grooves of the elevator up to meet the odd numbered wafers, Sloped "mouths" or upper portions of the grooves of the elevator cause the back surfaces of the odd even numbered wafers to gently "clap" against the back surfaces of the even numbered wafers, so that each pair of back-to-back wafers is supported in the same groove of the elevator.

In either case, all of the odd and even numbered wafers are retained in the head region of the wafer transfer machine as the elevator of the automatic wafer transfer machine is lowered.

The boat section 2 of the cage-type carrier of the present invention then is placed on the stage of the wafer transfer machine and is lifted by the elevator into the wafer transfer region, lifting the pairs of back-to-back loaded wafers from the wafer edge retainers of the head region. Each of the wafers may be retained in the head region in its own sets of coplanar grooves in the fashion shown in FIG. 4. Or the wafers of each back-to-back pair in the head region may be retained in the same set of coplanar stepped grooves. In any event, the wafer edge retainers, then are drawn clear of the lifted wafers and the loaded boat section 2 is lowered to the stage of the wafer transfer machine and removed. The cover section 3 then is placed on it as described above, and the loaded, covered cage-type carrier then is placed in a suitable furnace or the like for further processing.

FIGS. 4 and 5 illustrate one suitable structure for the wafer edge retaining slots in the wafer edge retainers 22 and 23. In this case, each wafer of a back-to-back pair is retained in separate adjacent slots such as 36 on one end of the retainer 23. Retainer 24 is, of course, entirely similar. In order to achieve the above structure, the above-mentioned pass-through slots 55, are provided in the opposite side of retainer 23. The first wafer of each pair is loaded into wafer edge retaining slots 36A on the same side of retainer 23 as the pass-through slots 55. When the second group of wafers, which have been rotated so that their back faces are oriented in the opposite direction of the first group of wafers, is lifted into the head region and the wafers move through pass-through slots 55, both groups of wafers are then retained in slots 36.

FIG. 5 illustrates precisely how retainer 23 is rotated to engage a portion of the edges of wafer 13 below center line 27, while still clearing the upper rail 5 of lower section 2 of the cage-type wafer carrier.

FIG. 6 shows an alternate embodiment of the cage-type wafer carrier in which an integral disk or end plate 44 is attached to the left end of boat section 43, and a similar circular end plate 46 is attached to the right end portion of cover section 45. Dashed line 48 shows how cover section 45 must be axially aligned with boat section 43 and horizontally moved to cover boat section 43. Alternately, both circular end plates 44 and 46 may be attached to the boat section 43, in which case the diameter of at least one of the end plates must be small enough to allow a small amount of clearance to the inner surface of cover section 3 as it is properly horizontally positioned on boat section 2, as previously described with reference to the earlier drawings.

Suitable openings may be provided in the bottom of boat section 43, and the end plates 44 and 46, and in the upper surface of cover section 45 as determined to be necessary by the user in order to achieve extremely uniform flow of reactant gas between the wafers supported in and surrounded by the cage-type carrier 42. In some instances, such openings may take the form of radial slots such as those indicated by dotted line 50 in boat section 43. Radial slots such as those designated by reference numeral 51 also may be provided in cover section 45 to provide the desired reactant gas flow. Suitable openings such as 52 and 53 also may be provided in end plates 46 and 44, respectively, for the same purpose.

It can be readily seen that the embodiment of the invention shown in FIG. 6 provides a very "closed" environment for the wafer 13 loaded therein. This may be desirable in certain manufacturing processes, especially low temperature processes.

While the invention has been described with reference to a particular embodiment thereof, those skilled in the art will be able to make various modifications to the described embodiments of the invention without departing from the true spirit and scope thereof. It is intended that all cage-type wafer carrying apparatus and methods which are equivalent to those described herein in that they perform substantially the same function in substantially the same way to achieve the same result are within the scope of the invention.

For example, the flanges 11 and 12 could be attached to boat section 2 and lips 5A and 6A could be attached to cover section 3. And, of course, the boat section 3 need not be actually raised into the head section, as described above; the head section could instead be lowered to surround the wafers supported by boat section 2.

What is claimed is:

1. A carrier for supporting a plurality of wafers, the carrier comprising in combination means for supporting wafers at elevated temperatures in a reactant uniform gas flow wherein the means allows wafer edge retainers to engage edges of the wafers at points lower than their centers to load the wafers into and unload the wafers from the carrier, the means including:
   (a) a lower section including a semicylindrical first surface that subtends a first arc substantially less than 180 degrees, the lower section having opposed sides between which the first arc extends;
   (b) slotted means for supporting the plurality of wafers in precise spaced, parallel relationship to each other above the first surface; and
   (c) an upper section including a semicylindrical second surface that subtends a second arc that is substantially greater than 180 degrees, the sum of the first and second arcs being approximately 360 degrees, the upper section resting on the lower section so that the first surface and the second surface form a cylindrical surface surrounding the edges of the plurality of wafers, the slotted means supporting the wafers so that the spacing between the wafer edges and the first and the second surfaces is sufficiently uniform to effectuate the uniform flow of the reactant gases, the first arc subtending a sufficiently small angle that the edges of the wafers extend laterally outward beyond the opposed sides of the lower section, whereby the wafer edge retainers can engage edges of the wafers at points above the opposed sides of the lower section and below the centers of the wafers before the upper section is placed on the lower section.

2. The carrier of claim 1 including at least one opening in the lower section positioned in the first surface to effectuate uniform flow of reactant gas between the wafers.

3. The carrier of claim 2 including at least one opening in the upper section positioned in the second surface to effectuate uniform flow of reactant gas between the wafers.

4. The carrier of claim 1 including means for limiting upward displacement of the upper section relative to the lower section while the upper section is aligned over the lower section in order to prevent the upper section from being lifted upward relative to the lower section and dislodging wafers from the slotted means.

5. The carrier of claim 1 wherein the lower section includes a relatively thin semicylindrical layer of material and wherein the upper section also includes a relatively thin semicylindrical layer of material.

6. The carrier of claim 5 composed of material selected from the group consisting of quartz, silicon carbide, and polycrystalline silicon.

7. The carrier of claim 5 wherein the slotted means include at least two slotted rods attached to the first surface.

8. The carrier of claim 1, wherein the first and second surfaces have approximately equal radii of curvature.

9. The carrier of claim 8 wherein the centers of the wafers approximately coincide with the centers of the radii of curvature of the first surface.

10. The carrier of claim 9 wherein the clearance between the first and second surfaces and the edges of the wafers is in the range from about 2 millimeters to 5 millimeters.

11. The carrier of claim 1 including first end cover means attached to one end of the lower section for covering a first end of the carrier when the upper section is positioned to cover the lower section, and also including second end cover means attached an opposite end of the upper section for covering a second end of the carrier when the upper section is positioned to cover the lower section, thereby forming an enclosed region within which the plurality of wafers are supported.

12. The carrier of claim 11 wherein the first and second end covering means include first and second disks, respectively.

13. The carrier of claim 1 wherein no opening in the lower section is large enough to allow an elevator member of an automatic wafer transfer machine to pass therethrough.

14. A method of automatically loading and unloading a plurality of wafers into and out of a carrier including a lower section for supporting the wafers and an upper section for covering the lower section and the wafers therein, the method comprising the steps of:

(a) retaining the wafers in a head region of an automatic wafer transfer machine by means of wafer edge retainers that engage edges of the wafers at points substantially below horizontal center lines of the wafers;

(b) raising the lower section of the carrier into the head region so that wafer-supporting slots of the lower section engage edges of the wafers and lift the wafers above the wafer edge retainers, the lower section of the carrier having horizontal upper edges that extend only as far upward as points a predetermined distance below points of the wafer edges that are engaged by the retainers; wafer edge (c) moving the wafer edge retainers so that they are clear of the wafers;

(d) lowering the lower section of the carrier and the wafers therein from the head region;

(e) positioning the upper section of the carrier adjacent to one end of the lower section and axially aligning the upper section with the lower section and the wafers therein;

(f) moving the upper section horizontally over the lower section and the wafers therein so that no portion of the upper section touches any of the wafers or the lower section; and (g) lowering the upper section onto the lower section, whereby an inner surface of the upper section and an inner surface of the lower section form a cylindrical surface enclosing the wafers.

15. The method of claim 14 including performing a processing operation including passing reactant gas into the region surrounded by the upper and lower sections and causing the reactant gas to flow uniformly between the wafers supported therein, and then removing the upper section by raising it slightly above the lower section and then moving the upper section horizontally so that no portion of the upper section touches the lower section or any of the wafers supported therein until the upper section is completely clear of the wafers in the lower section.

16. The method of claim 15 including raising the lower section into the head region of the automatic wafer transfer machine and positioning the wafer edge retainers so that they will engage edges of the wafers at points substantially below the horizontal center lines of the wafers, and lowering the lower section of the carrier to leave the wafers suspended in the head region.

17. A method of automatically loading and unloading a plurality of wafers into and out of a carrier including a lower section for supporting the wafers and an upper section for covering the lower section and the wafers therein, the method comprising the steps of:

(a) retaining the wafers in a head region of an automatic wafer transfer machine by means of wafer edge retainers that engage edges of the wafers at points substantially below horizontal center lines of the wafers, (b) producing relative movement between the lower section of the carrier and the head region so that wafer-supporting slots of the lower section engage edges of the wafers and the wafers are positioned above the waver edge retainer, the lower section of the carrier having horizontal upper edges that extend only as far upward as points a predetermined distance below points of the wafer edges that are engaged by the wafer edge retainers;

(c) moving the wafer edge retainers to that they are clear of the wafers;

(d) producing relative movement between the head region and the lower section of the carrier and the wafers therein, so that the lower section of the carrier and the wafers therein are below the head region;

(e) positioning the upper section of the carrier adjacent to one end of the lower section and axially aligning the upper section with the lower section and the wafers therein;

(f) moving the upper section horizontally over the lower section and the wafers therein so that no portion of the upper section touches any of the wafers or the lower section; and (g) lowering the upper section onto the lower section, whereby an inner surface of the upper section and an inner surface of the lower section form a cylindrical surface enclosing the wafers.

* * * * *